United States Patent [19]

Kreuzer

[11] Patent Number: 4,724,419
[45] Date of Patent: Feb. 9, 1988

[54] METHOD AND CIRCUIT ARRANGEMENT FOR CONVERTING A MEASURED VOLTAGE INTO A DIGITAL VALUE

[75] Inventor: Manfred Kreuzer, Weiterstadt, Fed. Rep. of Germany

[73] Assignee: Hottinger Baldwin Measurements, Inc., Framingham, Mass.

[21] Appl. No.: 10,758

[22] Filed: Feb. 4, 1987

[30] Foreign Application Priority Data

Feb. 7, 1986 [EP] European Pat. Off. ........ 86101578.2

[51] Int. Cl.⁴ .............................................. H03M 1/12
[52] U.S. Cl. ........................ 340/347 AD; 340/347 NT
[58] Field of Search ................ 340/347 AD, 347 NT; 324/99 P

[56] References Cited

U.S. PATENT DOCUMENTS

| | | | |
|---|---|---|---|
| 3,192,371 | 6/1965 | Brahm | 340/347 AD |
| 3,500,109 | 3/1970 | Sugiyama | 340/347 AD |
| 3,673,395 | 6/1972 | Tripp | 340/347 AD |
| 3,942,172 | 3/1976 | Tucker | 340/347 NT |
| 4,588,984 | 5/1986 | Dorsman | 340/347 NT |

Primary Examiner—Charles D. Miller
Attorney, Agent, or Firm—W. G. Fasse; D. H. Kane, Jr.

[57] ABSTRACT

A measured voltage is converted into a digital value according to the follow-up principle. A compensation signal is added to the measuring signal so that the mean value of both signals becomes zero. The compensation signal is formed from at least two auxiliary compensation values which are each a square wave signal having a fixed frequency and a keying ratio which is adjustable independently of the other square wave voltage. The keying ratios are varied or adjusted so that the compensation signal compensates the measured signal. In order to achieve this the value deviating from zero of the sum of the measured signal and the compensation signal is integrated, converted into digital values, and supplied to a PI-or PID-control circuit which controls in a closed loop manner the keying ratios of the square wave signals. The I-value of the PI- or PID-control circuit serves as a measure of the measured voltage.

8 Claims, 4 Drawing Figures

METHOD AND CIRCUIT ARRANGEMENT FOR CONVERTING A MEASURED VOLTAGE INTO A DIGITAL VALUE

FIELD OF THE INVENTION

The invention relates to a methed for converting at least one measured or test voltage into a digital value according to the follower or follow-up principle in which a compensation signal is added to the measured signal so that the mean value of the measured signal and of the compensation signal becomes zero in the balanced state. The invention further relates to a circuit arrangement for carrying out such a method of digitizing a measured voltage.

DESCRIPTION OF THE PRIOR ART

German Patent Publication (DE-PS) No. 2,952,311 discloses such a method and circuit arrangement for digitizing a measured voltage. The digitizing is achieved according to the follower or follow-up principle wherein a compensation signal is added to the measured signal so that the mean value of the measured signal and the compensation signal become zero in the balanced or matched state. The compensation signal is composed of at least two auxiliary compensation values which are square wave signals having fixed frequencies and keying ratios which may be adjusted independently of one another. When the mean value of the sum comprising the measured signal and the compensation signal deviates from zero, the keying ratios of these square wave signals are adjusted so that the mean value again becomes zero.

OBJECTS OF THE INVENTION

In view of the foregoing it is the aim, of the invention to achieve the following objects singly or in combination:

to provide a method for converting a measured voltage into a digital value wherein, compared to the prior art, higher adjustment or rather follow-up speeds and shorter transient or response times may be achieved;

the foregoing is to be achieved with a circuit arrangement which is substantially simpler and hence less costly than prior art circuits;

to achieve a high resolution (at least $10^6$ steps) of the mean value of the compensation voltage and a high measuring sequence rate (at least 100 kHz) in such a method and circuit arrangement;

to achieve even higher or almost unlimited resolution and measuring sequence rates through the use of more than two square wave voltages for providing the compensation voltage in such a method and circuit arrangement;

to achieve the analog-to-digital conversion over a wide frequency range of the measured analog signal and to ensure the stability of the present circuit arrangement throughout said frequency range by appropriately adjusting the mode and operation of a PI- or PID-control circuit in such a circuit arrangement; and to adapt the present method and circuit to all types of signals that are being measured including signals having high frequency components, signals that are, varying in a steady manner or quasi static signals, and low frequency signals.

SUMMARY OF THE INVENTION

The above objects have been achieved according to the invention by a method for converting a measured voltage into a digital value according to the follower or follow-up principle in which a compensation signal $U_K$ is added to the measured signal $U_m$ as described above. According to the invention a zero or null signal composed by summing the measured signal $U_m$ and the compensation signal $U_K$ is integrated by an integrator. The output voltage of the integrator having a fixed frequency $f_T$ is then converted into a digital value. A null balancing value is formed by subtracting a fixed given numerical value from the digital value. The null balancing value is supplied to a digital PI- or PID-control circuit (proportional integrator or proportional integrator-differentiator) which adds to its I-(integral) value a value given as the product of the null balancing value times a prescribed I-factor. A P-value equal to the product of the null balancing value times a prescribed P-factor is formed by the PI- or PID-control circuit. In case a PID control circuit is used a difference value is formed in that the previous null balancing value is subtracted from the new null balancing value and this difference value is multiplied by a prescribed D-factor in order to produce a D-value. The P, I, and possibly also the D-values are added to a PID-value and the keying ratios of auxiliary compensation values are adjusted or set to the PI- or PID-values. The I-value is taken as a measure of the measuring voltage.

The above method of the invention is carried out by a circuit arrangement according to the invention in which the sum of the measured signal and of the compensation signal $U_K$ is applied to the input of an integrator. The output of the integrator is connected to one input of a comparator. The second input of the comparator is supplied with a triangle or saw-tooth voltage of constant amplitude and constant frequency. The output of the comparator is connected with one input of a gate circuit (AND). The output voltage of an oscillator or clock signal generator with a given frequency is supplied to the other input of the AND gate circuit. The output of the gate circuit is connected with the input of a counter providing a digital output which is connected to one input of a control circuit. The output voltage of the clock signal oscillator is supplied simultaneously to a frequency splitter or divider providing a square wave output voltage to a trigger input of the control circuit and also to the input of the integrator which converts the square wave voltage into the triangle or saw-tooth voltage supplied to the second input of the comparator. Each respective output of the control circuit is connected to the control input of a selector switch. The selector switches alternately connect reference voltages $+U_{ref}$ and $-U_{ref}$ to a "weighted" resistor circuit in response to the control voltages of the control circuit for producing auxiliary compensation voltages which form the compensation signal. The resistor circuit with its resistors ($R_3$; $N \times R_3$) provides a weighting ratio of N:1.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
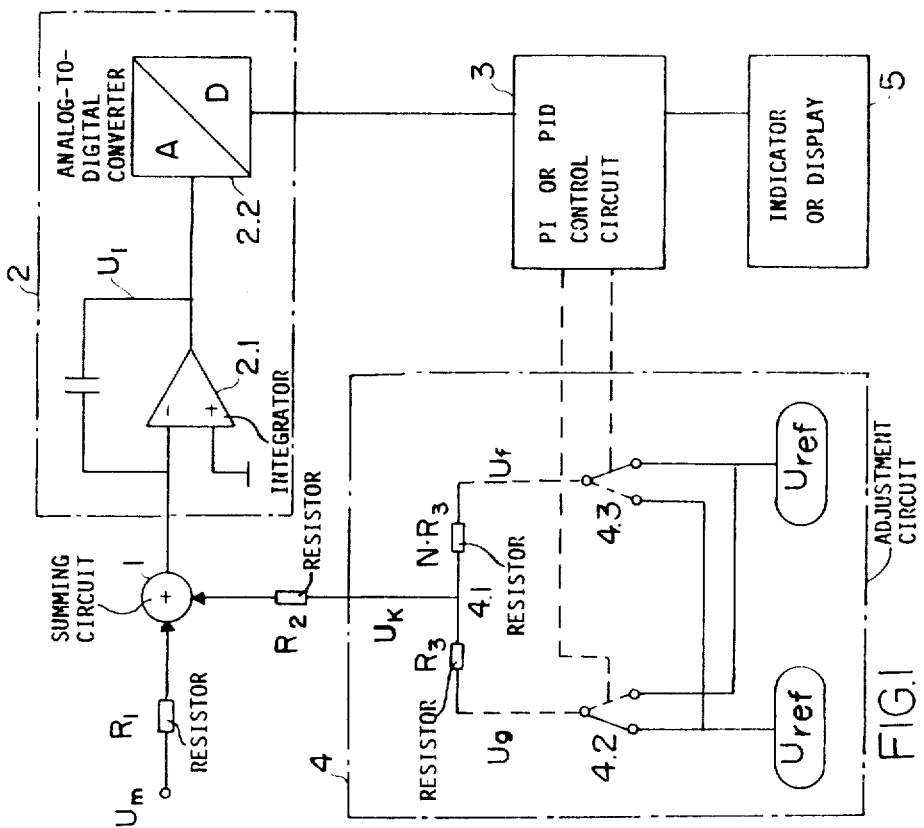
FIG. 1 is a basic circuit diagram of the present circuit arrangement for carrying out the method of digitizing a measuring voltage according to the invention.

As shown in FIG. 1, a measured voltage $U_m$ is supplied through a resistor $R_1$, and a compensation voltage $U_K$ is supplied through a resistor $R_2$ to a compensation point 1, such as a summing circuit. At the compensation point 1 the supplied voltage signals are added and supplied to the negative input of an integrator 2.1 forming part of a null amplifier 2. If the mean value of the signal at the compensation point 1, that is, at the input of the integrator 2.1, is not equal to zero or null, then the output voltage $U_I$ of the integrator 2.1 changes. The voltage $U_I$ is converted in an analog-to-digital converter 2.2 of the null amplifier 2 into a corresponding null balancing value. The digital zero or null balancing value is interrogated or sampled by a digitally operating PI- or PID-control circuit designated in the following simply as controller 3. If this null balancing value deviates from a prescribed value, usually the value zero, the controller 3 evaluates the deviation with its proportion (P), integral (I) and, if applicable differential (D), algorisms add the PI or PID results and adjusts the keying ratios of the switches 4.2 and 4.3 to the PI- or PID-value in an adjustment circuit 4, wherein the adjustments or settings of high value are provided by the switch 4.2 and the settings or adjustments of low value are provided by the switch 4.3.

The switches 4.2 and 4.3 are switched over with a constant frequency $f_T$ but with variable keying ratios between the two reference voltages $-U_{ref}$ and $+U_{ref}$. The two keying ratios are determined by counting a higher frequency $f_t$ which is an integral multiple of the constant switching frequency $f_T$.

Square wave voltages $U_g$ and $U_f$ are generated at the switches 4.2 and 4.3, respectively. The mean values of the square wave voltages $U_g$ and $U_f$ may be adjusted between $-U_{ref}$ and $+U_{ref}$ by means of varying their keying ratios proportionally to their respective keying ratio. The two voltages $U_g$ and $U_f$ are weighted in accordance with a ratio N, by means of the resistances $R_3$ and $N \times R_3$ to form the compensation voltage $U_K$. The weighting factor $N = U_g/U_f$. As an example, consider $f_T = 1$ kHz, $f_t = 1$ MHz, a PI- or PID-value=435.783, and a weighting factor or ratio $N=1000$, whereby a keying ratio of 1000:435 is obtained for the switch 4.2 and a keying ratio of 1000:783 is obtained for the switch 4.3.

The keying ratios are adjusted until the mean value of the sum voltage at the compensation point 1 becomes zero. In this state $$U_m = -\frac{R_1}{R_2} \times U_K.$$

Because $R_1$ and $R_2$ are known, and since the compensation voltage $U_K$ is determined by the two keying ratios of $U_g$ and $U_f$, the measuring voltage $U_m$ may also be determined with a high resolution precision. The appropriate integral value I from the controller 3 is displayed on a display device 5 as a measure for the measuring value.

For reasons of stability the proportional components (P) are required by the adjustment circuit 4. The use simply of an integral (I) controller together with the integrator 2.1 in the null amplifier 2 would produce a 180° phase condition and thereby lead to an instability. If the control loop includes, in addition to the integrator, other elements and functions which cause run or dead times, for example filter and controller computation times, then additional differential (D) components are necessary for achieving stability for optimum control loop adjustments, for example, to achieve an aperiodic transient characteristic response.

The two voltages $U_g$ (coarse or gross voltage) and $U_f$ (fine voltage) which both have an adjustable keying ratio, represent different weighting factors or values $W_g$ and $W_f$ in their effect upon the compensation voltage $U_K$. The weighting values are in such a ratio that $W_g:W_f=N:1$. For instance, if the keying ratio of the voltages $U_g$ and $U_f$ may be adjusted in T/1000 steps, and if the ratio of the weighting values is chosen with $N=1000$, then the mean value of the compensation voltage $U_K$ may be adjusted over $10^6$ steps, that is with a very high resolution or precision.

If a technically possible high frequency of 100 MHz is used for counting out the key ratios of the switched square wave voltages $U_g$ and $U_f$, then a measuring sequence of 100 kHz is achieved. That is, every ten microseconds a digital value having a resolution of $10^6$d (1d=one digital step) is available. Thus, the invention achieves a combination of resolution and measuring sequence rate or sampling rate which has not been possible in any previously known analog-to-digital conversion method or device.

Even higher measuring or sampling rates and higher resolutions of the digital value are achievable if an adjustment circuit with more than the described two steps or rather switches are used. That is, the sampling rate and resolution may be improved when three or more weighted square wave voltages with independently variable keying ratios are used to form the compensation voltage $U_K$.

With the present invention a practically unlimited high resolution of the matching or balancing loop circuit may be achieved, since even the smallest differences between the measuring signal $U_m$ and the mean value of the compensation signal $U_K$ at point 1, cause the output voltage of the integrator 2.1 to slowly wander away from the zero or null point until the null threshold of the analog-to-digital converter 2.2 is exceeded. The A/D converter 2.2 then supplies a value deviating from zero to the digital controller 3 which causes the very high resolution adjustment circuit 4 to be readjusted by one step.

If occasionally measured signals having high dynamic signal components are to be sampled, it is also possible to increase the PI or PID coefficients of the controller 3 for achieving an increase in the measuring signal band width at a lower resolution. The highest signal band widths are achieved when the controller 3 is switched to the P or PD operating mode and the proportional P-value is used as the digital measuring value. However, then the resolution is sharply reduced. In this case, in principle, the resolution cannot be larger than the resolution of the analog-to-digital converter 2.2.

Automatically varying the PID coefficients of the controller 3 dependent upon the digital value of the analog-to-digital converter 2.2, leads to a non-linear control. By means of such an effective non-linear control it is possible, on the one hand, to determine a measured value with an extremely high resolution and at a constant high measuring or sampling rate for measured signals varying steadily at a slow or medium rate. On the other hand, such a non-linear control achieves a very fast following of the measured signal even for very fast or random measured signal variations, however, with a reduced resolution.

Thus, the method and circuit arrangement of the invention may be adapted to perform optimally for various measuring conditions simply by changing the control characteristics of the controller 3. The present method and circuit arrangement achieve optimal results for example, for measuring signals with high frequency components, and for measured signals changing at a steady rate or for quasi static signals. Only very small or minimum accuracy is required for the analog-to-digital converter 2.2 because it is arranged within the controlling loop and because in the PI or PID operating modes of the controller 3 in the matched or balanced state, the A/D converter 2.2 always needs to output only one zero or null value, whereby neither its null point errors nor its sensitivity errors have any effect on the measured value. Thus, in the simplest case the three output states: zero, >zero, and <zero would be sufficient for the A/D converter 2.2. However, it is more favorable in terms of the control technique, if the analog-to-digital converter 2.2 provides a digital value with a resolution which is as high as possible.

Figure 2:
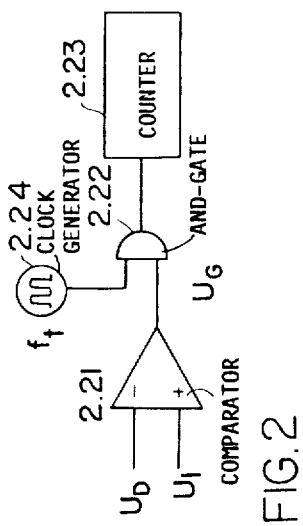
FIG. 2 is a circuit diagram of an especially simple embodiment of the analog-to-digital converter of FIG. 1.
Figure 3:
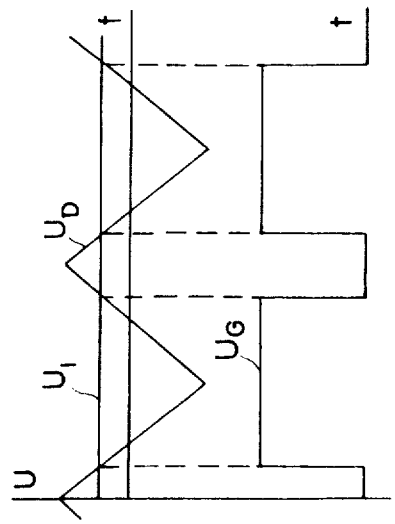
FIG. 3 is a voltage versus time plot of the voltages associated with the analog-to-digital converter according to FIG. 2.

FIG. 2 shows a simple embodiment of the analog-to-digital converter 2.2 according to FIG. 1. The mode of operation of the A/D converter of FIG. 2 will now be described with reference to FIG. 3.

The voltage $U_I$ which is variable in its level yet remains relatively constant over a short time, is supplied to the input of a comparator 2.21. A triangle wave of saw-tooth voltage $U_D$ is supplied to the other input of the comparator 2.21. The comparator 2.21 outputs a square wave voltage $U_g$ having a constant frequency equal to the frequency of the triangular wave voltage. However, the keying ratio of the output square wave voltage $U_G$ varies linearly with the voltage $U_I$. By counting out the keying ratio of $U_G$, a digital measured value for the voltage $U_I$ may be determined. For this purpose the positive voltage level of $U_G$ controls an AND-gate circuit 2.22 to open and during this time allows the counting impulses with the frequency $f_t$ from the synchronizing clock generator 2.24 to pass through the AND-gate to the counter 2.23. If the measuring sequence frequency of 100 kHz is taken for the triangle wave frequency corresponding to the above mentioned example and the 100 MHz time rate is taken for the timing frequency $f_t$ then every ten microseconds a digital value will appear at the output of the counter 2.23 in the range of + or −500 d, whereby "d" is the resolution. The highest follow-up rate may thus be expressed as $50 \times 10^6$ d/s. The total conversion range of $10^6$ d could therefore be run through in a minimum of 20 ms. However, if the controller 3 does not react linearly, this time may be further reduced considerably.

Figure 4:
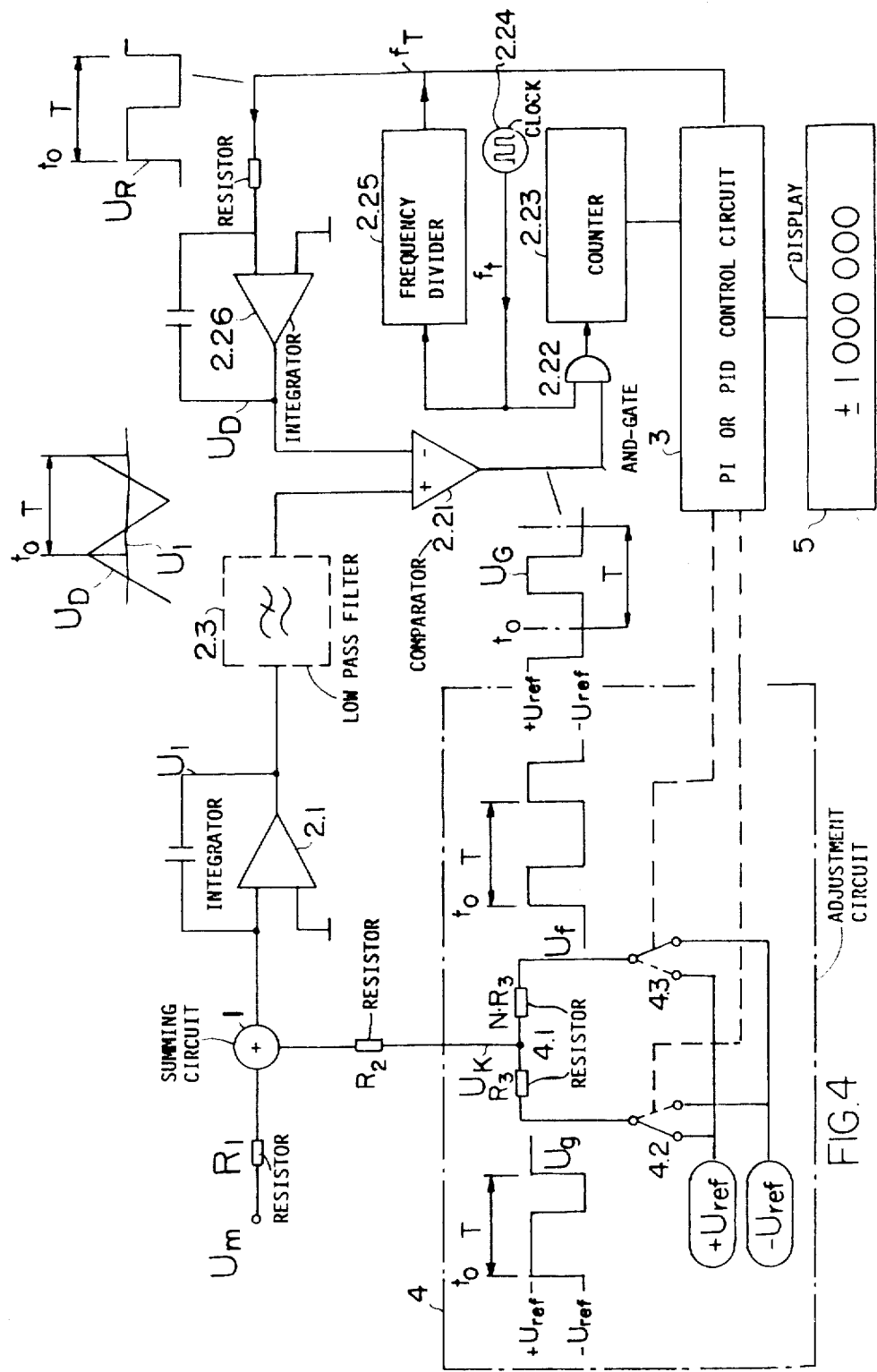
FIG. 4 is a detailed circuit diagram of the circuit of FIG. 1 according to the invention.

As far as FIG. 4 corresponds to FIGS. 1 and 2, the same components carry the same reference numbers. However, the example embodiment of FIG. 4 additionally includes a frequency divider 2.25, an integrator 2.26 which converts the square wave voltage $U_R$ into the triangle wave volta $U_D$, and a low pass filter 2.3. In many instances, the integrator 2.26 may be replaced by an RC network.

The frequency divider 2.25 divides the clock frequency $f_t$ by an integral number, for example corresponding to the above mentioned example with a ratio of 1000:1, into the square wave voltage $U_R$ with the frequency $f_T$ and the period duration T. The square wave voltage $U_R$ is applied on the one hand to the integrator 2.26 which forms the triangle wave voltage $U_D$. On the other hand, the positive portion of $U_R$ triggers the controller 3 which then reads the counter of the counter 2.23 at a frequency $f_T$ and generates the switching voltages for the switches 4.2 and 4.3.

The low pass filter 2.3 is only shown with dashed lines in FIG. 4 because the use of such a filter is not always necessary. In addition to the integrator 2.1 of the null amplifier 2, the filter 2.3 damps the dynamic components of the null signal. Therefore, by using a low pass filter 2.3 the time constant of the integrator 2.1 may be shortened. However, the low pass filter 2.3 should be so optimized that the shortest balancing or matching times of the entire circuit can be achieved.

Although the invention has been described with reference to specific example embodiments, it will be appreciated that it is intended to cover all modifications and equivalents within the scope of the appended claims.

What I claim is:

1. A method for digitizing a measured analog signal, comprising the following steps:
   (a) producing a compensation signal and adding said compensation signal to said measured analog signal to form a sum signal in such a way that a mean value of said sum signal becomes zero when said measured signal and said compensation signal are balanced,
   (b) said producing of said compensation signal comprising providing at least two auxiliary compensation values in the form of fixed frequency ($f_T$) square wave signals each having a keying ratio adjustable independently of the keying ratio of any other auxiliary compensation value,
   (c) modifying said keying ratios in response to a deviation of said mean value from zero in such a way that said mean value returns to zero to form a null signal,
   (d) integrating said null signal to form an integrated signal having said fixed frequency ($f_T$),
   (e) converting said fixed frequency integrated signal into a digital value,
   (f) subtracting a fixed value from said digital value to provide a null balancing value having an I-value,
   (g) supplying said null balancing value to a control circuit,
   (h) multiplying, in said control circuit, said null balancing value with a given integration factor (I-factor) to form a first product value,
   (i) adding said first product value to said I-value of said null balancing value,
   (j) multiplying, in said control circuit, said null balancing value with a given proportionality factor (P-factor) to form a second product value (P-value),
   (k) adding said I-value and said second product value (P-value) to form a PI-value, (l) wherein said modifying step is performed by adjusting said keying ratios of said auxiliary compensation values in accordance with said PI-value, and (m) using said I-value as a measure of said measured analog value.

2. The method of claim 1, further comprising providing said control circuit with differentiator circuit means, subtracting, in said differentiator circuit means, from a new null balancing value the preceding null balancing value to form a difference value, multiplying said difference value in said control circuit, with a given D-factor to produce a D-value, adding said D-value to said PI-value to form a PID-value, and performing said modifying step by adjusting said keying ratios of said auxiliary compensation values in accordance with said PID-value.

3. The method of claim 2, further comprising varying said PI-value or said PID-value in such a way that, in accordance with the required resolution, any transient times are minimized and the frequency band width of the measured analog value is maximized.

4. The method of claim 2, further comprising operating said control circuit in a non-linear manner in response to a control function, so that said PI- or PID-values (coefficients) are modified for a rapid follow-up of very rapid measured signal variations with a reduced resolution, and for a slower follow-up of slower measured signal variations with a respectively higher resolution.

5. The method of claim 2, further comprising switching said control circuit from a PI-mode or from a PID-mode to a P- or PD-mode for processing a maximally wide frequency band width of said measured analog signal, and using a proportional value of said control circuit as the measured value.

6. An apparatus for digitizing a measured analog signal in accordance with the follow-up principle, comprising a summing circuit having an input for said measured analog signal, a further input for a compensating signal and a sum output, first signal integrator means (2.1) having an input connected to said sum output, a comparator connected with one input to an output of said first signal integrator means, means for providing a saw-tooth voltage having a constant amplitude and a constant frequency ($f_T$) connected to another input of said comparator, an AND-gate having one input connected to an output of said comparator, oscillator (2.24) means providing a signal with a frequency ($f_t$) connected to another input of said AND-gate, signal counter means having an input connected to an output of said AND-gate, control circuit means for providing said compensating signal, said signal counter means having a digital output connected to a trigger input of said control circuit means, frequency divider means connected to said oscillator means and providing at an output a square wave with the frequency ($f_T$), said saw-tooth voltage providing means comprising second integrator means (2.26) for converting said square wave into said saw-tooth voltage, said second integrator means having an input connected to said frequency divider means, change-over switching means for supplying said compensating signal to said further input of said summing circuit, said change-over switching means having control inputs connected to respective control outputs of said control circuit means for controlling the operation of said change-over switching means in response to control signals provided at said control outputs of said control circuit means (3), said change-over switching means producing auxiliary compensating voltages from reference voltages, and resistor circuit means connecting said change-over switching means to said further input of said summing circuit, said resistor circuit means providing a weighting ratio of N:1 for said auxiliary compensating voltages.

7. The apparatus of claim 6, wherein said control circuit means comprise proportional integrator circuit means.

8. The apparatus of claim 7, wherein said control circuit means further comprise differentiator means for producing a difference signal, and switch means for changing an operational mode of said control circuit means.

* * * * *

UNITED STATES PATENT AND TRADEMARK OFFICE
CERTIFICATE OF CORRECTION

PATENT NO. : 4,724,419

DATED : February 9, 1988

INVENTOR(S) : Manfred Kreuzer

It is certified that error appears in the above-identified patent and that said Letters Patent is hereby corrected as shown below:

Claim 1, (column 6, line 57), after "circuit" insert --including a proportional integrator--.

Claim 6, (column 8, line 32), replace "weighting" by --weighing--.

Signed and Sealed this

Fifth Day of July, 1988

Attest:

DONALD J. QUIGG

*Attesting Officer*   *Commissioner of Patents and Trademarks*